(12) United States Patent
Moshayedi et al.

(10) Patent No.: US 8,437,190 B2
(45) Date of Patent: May 7, 2013

(54) INTERLEAVED FLASH STORAGE SYSTEM AND METHOD

(75) Inventors: Mark Moshayedi, Newport Coast, CA (US); Seyed Jalal Sadr, Irvine, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

(21) Appl. No.: 13/289,966

(22) Filed: Nov. 4, 2011

(65) Prior Publication Data

US 2012/0236643 A1    Sep. 20, 2012

Related U.S. Application Data

(62) Division of application No. 12/508,538, filed on Jul. 23, 2009, now Pat. No. 8,144,515.

(51) Int. Cl.
*G11C 11/34* (2006.01)
*G11C 16/04* (2006.01)
*G11C 7/00* (2006.01)

(52) U.S. Cl.
USPC ............ 365/185.11; 365/185.28; 365/185.29; 365/185.33; 365/220; 365/221

(58) Field of Classification Search ............. 365/185.11, 365/185.28, 185.29, 185.33, 220, 221
See application file for complete search history.

(56) References Cited

U.S. PATENT DOCUMENTS

| | | | |
|---|---|---|---|
| 2001/0033245 | A1 | 10/2001 | Campanale et al. |
| 2002/0049581 | A1 | 4/2002 | Liu |
| 2007/0288687 | A1 * | 12/2007 | Panabaker ............. 711/103 |
| 2009/0196102 | A1 | 8/2009 | Kim |
| 2010/0125695 | A1 | 5/2010 | Wu et al. |

* cited by examiner

*Primary Examiner* — Ly D Pham
(74) *Attorney, Agent, or Firm* — McDermott Will & Emery LLP

(57) ABSTRACT

A flash storage system accesses data interleaved among flash storage devices. The flash storage system receives a data block including data portions, stores the data portions in a data buffer, and initiates data transfers for asynchronously writing the data portions into storage blocks interleaved among the flash storage devices. Additionally, the flash storage system may asynchronously read data portions of a data block interleaved among the storage blocks, store the data portions in the data buffer, and access the data portions from the data buffer.

3 Claims, 7 Drawing Sheets

# US 8,437,190 B2

INTERLEAVED FLASH STORAGE SYSTEM AND METHOD

This application is a divisional application of U.S. patent application Ser. No. 12/508,538, filed on Jul. 23, 2009. The disclosure of this related application is hereby incorporated herein by reference.

BACKGROUND

1. Field of Invention

The present invention generally relates to computer memory and storage. More particularly, the present invention relates to a system and method of accessing and storing data in one or more flash storage devices.

2. Description of Related Art

A flash storage array includes multiple flash storage devices, such as flash storage chips. In one type of flash storage array, data is accessed in the flash storage devices serially via a data bus. In this process, a flash storage device is accessed individually until storage blocks of the flash storage device are used, and then the next flash storage device in the flash storage array is accessed. The performance of this type of flash storage array depends upon, and is limited to, the speed of accessing data in an individual flash storage device in the flash storage array as well as the speed of the data bus.

In another type of flash storage array, data is accessed in multiple flash storage devices to increase the throughput of the flash storage array. The flash storage array has multiple data busses, which allows data to be accessed synchronously in storage blocks of the storage devices. The number of storage blocks that can be accessed, however, is limited by the number of data busses in the flash storage array. Moreover, the access time of each storage block may vary. Consequently, the throughput of the flash storage array depends upon, and is limited to, the slowest access time among the storage blocks being accessed.

In light of the above, a need exists for improving the performance of a flash storage array.

SUMMARY

In various embodiments, a flash storage system includes storage blocks interleaved among flash storage devices. The flash storage system receives a data block including data portions, stores the data portions into a data buffer, and initiates data transfers for writing the data portions asynchronously into the storage blocks. Additionally, the flash storage system can initiate data transfers for reading data portions of a data block asynchronously from the storage blocks. Accessing data portions in the interleaved storage blocks asynchronously increases the throughput of the flash storage system in comparison to accessing the data portions synchronously. Further, the data blocks can be accessed in parallel without the need for a dedicated data bus for each storage block.

A method, in accordance with one embodiment, includes receiving a data block including data portions, and writing the data portions into a data buffer. The method further includes identifying storage blocks interleaved among flash storage devices, and initiating data transfers for writing the data portions asynchronously into the storage blocks.

A method, in accordance with one embodiment, comprises initiating data transfers for reading data portions of a data block asynchronously from storage blocks interleaved among flash storage devices. The method further includes writing the data portions into a data buffer and accessing the data portions of the data block.

A system, in accordance with one embodiment, includes a data buffer, flash storage devices, and a controller coupled to the data buffer and the flash storage devices. The flash storage devices include storage blocks interleaved among the flash storage devices. The data buffer is configured to receive and store a data block including data portions. The controller is configured to initiate data transfers for writing the data portions asynchronously into the storage blocks.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DESCRIPTION

In various embodiments, a flash storage system receives data portions of a data block from a host serially. The flash storage system asynchronously writes the data portions into storage blocks interleaved among flash storage devices of a flash storage array in parallel. Additionally, the flash storage system asynchronously reads data portions of the data block from the storage blocks in parallel and provides the data portions of the data block to the host serially.

Figure 1:
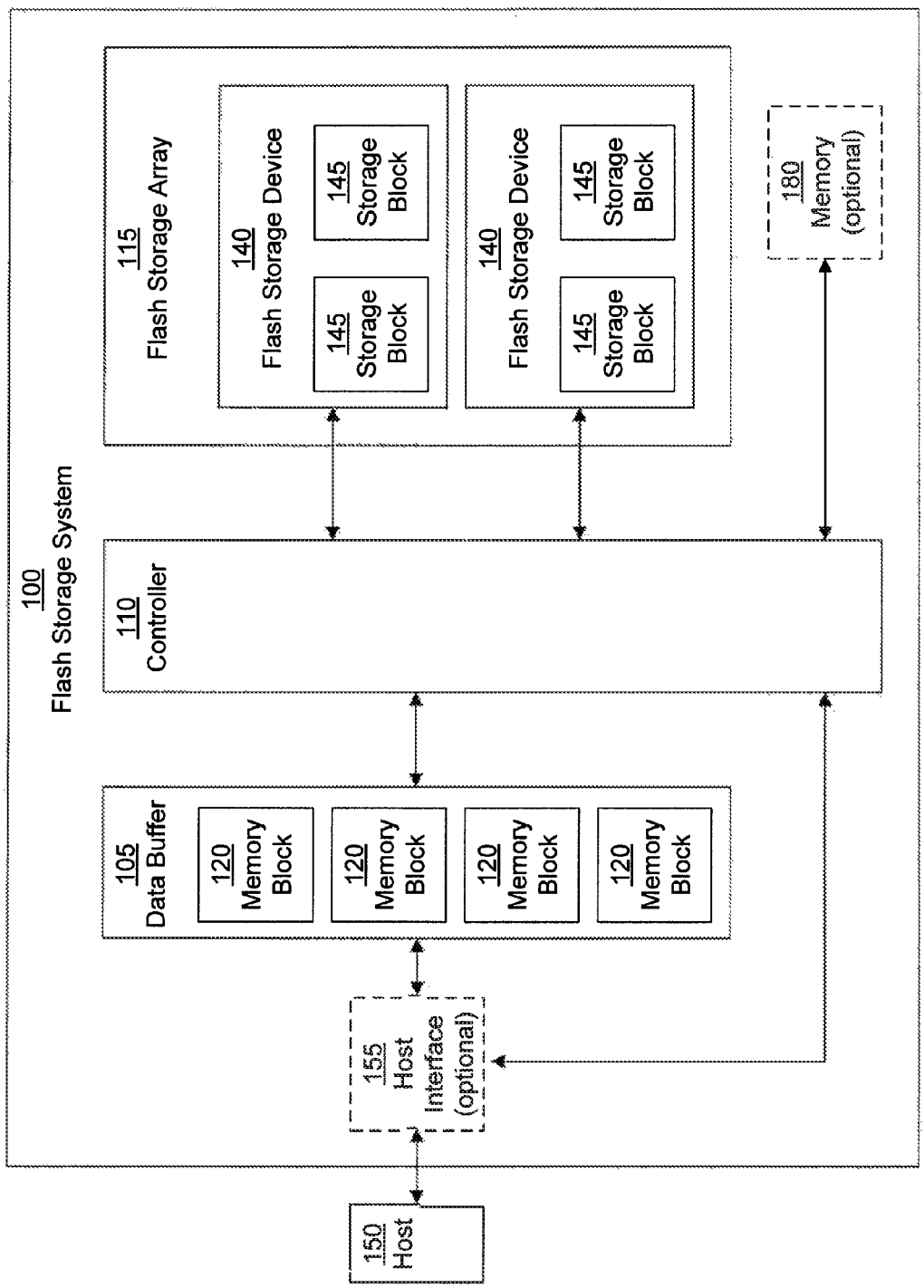
FIG. 1 is a block diagram of a flash storage system, in accordance with an embodiment of the present invention.

FIG. 1 illustrates a flash storage system 100, in accordance with an embodiment of the present invention. The flash storage system 100 includes a data buffer 105, a controller 110, a flash storage array 115, an optional host interface 155, and an optional memory 180. The data buffer 105 is coupled in communication with the controller 110 and includes memory blocks 120, each of which can store one or more data portions of a data block. The data buffer 105 may be a random access memory, a cache memory, a logic circuit, or the like. In the embodiment of FIG. 1, the data buffer 105 includes four memory blocks 120. In other embodiments, the data buffer 105 may include fewer or more memory blocks 120.

The flash storage array 115 includes an array of flash storage devices 140 and is coupled in communication with the controller 110. The flash storage devices 140 may be any type of data storage, such as flash storage cards, flash storage chips, solid-state devices, flash memory, or the like. In the embodiment of FIG. 1, the flash storage array 115 includes two flash storage devices 140. In other embodiments, the flash storage array 115 may include more than two flash storage devices 140. Each flash storage device 140 is coupled to the controller 110 and includes storage blocks 145. Each of the storage blocks 145 store one or more data portions of the data block. A data block may be any unit of data. For example, a data block may be a data bit, a data byte, a data word, a memory page, a logic sector, a data record, or a data file. The storage blocks 145 of the flash storage array 115 are interleaved among the flash storage devices 140. In the embodiment of FIG. 1, each flash storage device 140 includes two storage blocks 145. In other embodiments, the flash storage devices 140 includes more or less than two storage blocks 145.

In embodiments including the host interface 155, the data buffer 105 is coupled in communication with the host interface 155, and the host interface 155 is coupled in communication with a host 150. Additionally, the controller 110 is coupled in communication with the host interface 155. The host interface 155 facilitates communications between the host 150 and the data buffer 105. In embodiments without the host interface 155, the data buffer 105 is coupled in communication with the host 150. The memory 180 stores data for the controller 110 for controlling operation of the flash storage system 100. In embodiments including the memory 180, the controller 110 is coupled in communication with the memory 180. The host 150 may be any computing or electronic device, such as a computer workstation, an embedded computing system, a network router, a portable computer, a personal digital assistant, a digital camera, a digital phone, or the like.

The data buffer 105 receives data portions of a data block from the host 150 and stores the data portions into the memory blocks 120. Additionally, the controller 110 reads data portions of the data block from the storage blocks 145 and writes the data portions into the memory blocks 120. In this way, the data blocks fill one or more memory blocks 120 in the data buffer 105. The data buffer 105 may receive data portions from the host 150 serially. The controller 110 reads the data portions from the storage blocks 145 in parallel and writes the data portions into the data buffer 105 serially. The controller 110 may be a processor, a microprocessor, an embedded processor, a logic circuit, or the like. In embodiments including the host interface 155, the data buffer 105 receives data portions of the data block from the host 150 through the host interface 155.

The controller 110 also reads the data portions of the data block in the data buffer 105 and writes the data portions into the storage blocks 145 of the flash storage array 115. The controller 110 reads the data portions of the data block in the data buffer 105 sequentially and writes the data portions of the data block into the storage blocks 145 in parallel. Further, the controller 110 may simultaneously read a data portion in the data buffer 105 and write another data portion into one of the storage blocks 145. In this way, the throughput of the flash storage system 100 is increased.

In one embodiment, the controller 110 initiates data transfers for writing the data portions of the data block into the storage blocks 145 asynchronously. In this process, the controller 110 reads a first data portion of the data block in the data buffer 105 and begins to write the first data portion to one of the storage blocks 145 in the flash storage array 115. The controller 110 then reads a second data portion of the data block in the data buffer 105 when the first data portion is being written into the storage block 145. In this way, the controller 110 simultaneously reads a data portion of the data block from the data buffer 105 and writes another data portion of the data block into one of the storage blocks 145 of the flash storage array 115. Further, the controller 110 simultaneously writes multiple data portions into multiple storage blocks 145. Thus, the controller 110 reads the data portions of the data block from the data buffer 105 serially and writes the data portions of the data block into the storage blocks 145 in parallel.

The number of data portions in the data block may be greater than the number of flash storage devices 140 in the flash storage array 115. In this case, the controller 110 initiates successive data transfers for writing data portions of the data block into one of the storage blocks 145 of a flash storage device 140. Because the storage blocks 145 of the flash storage array 115 are interleaved among the flash storage devices 140, the controller 110 may initiate one or more data transfers to other flash storage devices 140 between the successive data transfers initiated to the storage block 145 of the flash storage device 140.

The data buffer 105 may receive data portions of a data block in the flash storage array 115 that are to be modified in the flash storage array 115. In this case, the data buffer 105 stores the data portions to be modified into the memory blocks 120. The controller 110 reads the remaining data portions of the data block from the flash storage array 115 and writes the remaining data portions into the memory blocks 120. In this way, the data block fills one or more memory blocks 120 in the data buffer 105. The controller 110 then erases the storage blocks 145 containing the data block. In one embodiment, the controller 110 erases the storage blocks 145 containing the data block in parallel. After the storage blocks 145 are erased, the controller 110 reads the data portions of the data block from the data buffer 105 and stores the data portions of the data block into the storage blocks 145. In some embodiments, the controller 110 need not erase the storage blocks 145 before the controller 110 stores the data portions of the data block into the storage blocks 145.

Figure 2:
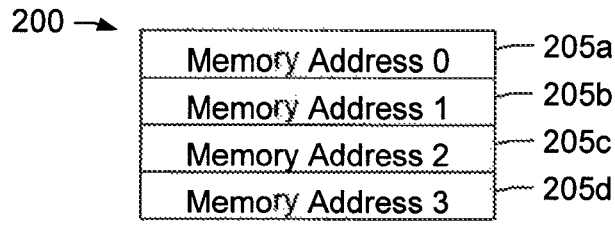
FIG. 2 is a block diagram of a memory map for a memory block, in accordance with an embodiment of the present invention.

FIG. 2 illustrates a memory map 200 of the memory block 120, in accordance with an embodiment of the present invention. The memory map 200 includes a sequence of memory addresses 205. In various embodiments, the memory block 120 may be addressed by logical addresses or physical addresses, or both. Accordingly, the memory addresses 205 may be logical addresses or physical addresses in the memory block 120. Although four memory addresses 205*a-d* are shown in FIG. 2, the memory block 120 may have more or fewer memory addresses 205. The memory block 120 stores a data portion of the data block at one or more of the memory addresses 205 of the memory block 120.

Figure 3:
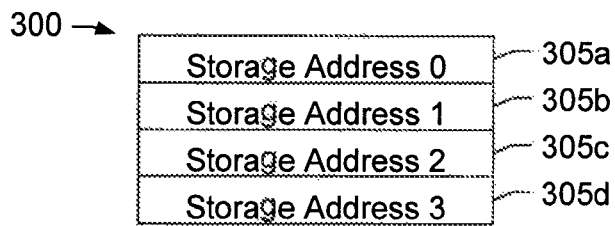
FIG. 3 is a block diagram of a storage map for a storage block, in accordance with an embodiment of the present invention.

FIG. 3 illustrates a storage map 300 of a storage block 145, in accordance with an embodiment of the present invention. The storage map 300 includes a sequence of storage addresses 305. In various embodiments, the storage block 145 may be addressed by logical addresses or physical addresses, or both. Accordingly, the storage addresses 305 may be logical addresses or physical addresses in the storage block 145. The storage block 145 stores a data portion of the data block into one or more storage addresses 305 of the storage block 145. Although four storage addresses 305*a-d* are shown in FIG. 3, the storage block 145 may have more or fewer storage addresses 305.

Figure 4:
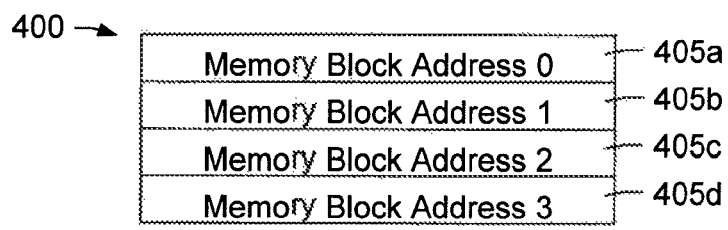
FIG. 4 is a block diagram of a memory map for a data buffer, in accordance with an embodiment of the present invention.

FIG. 4 illustrates a memory map 400 of the data buffer 105, in accordance with an embodiment of the present invention. The memory map 400 includes a sequence of memory block addresses 405 for the memory blocks 120 in the data buffer 105. Each memory block address 405 identifies a memory block 120 in the data buffer 105. Although four memory block addresses 405a-d are shown in FIG. 4, the data buffer 105 may have more or fewer memory block addresses 405.

Figure 5:
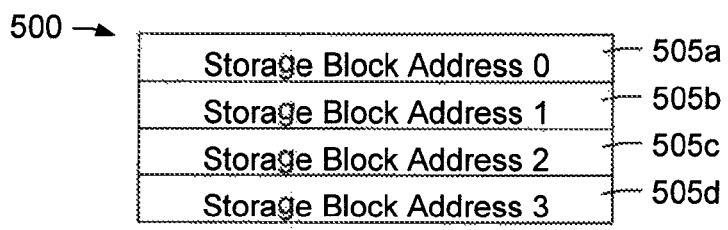
FIG. 5 is a block diagram of a storage map for a flash storage array, in accordance with an embodiment of the present invention.

FIG. 5 illustrates a storage map 500 of the flash storage array 115, in accordance with an embodiment of the present invention. The storage map 500 includes a sequence of storage block addresses 505 for the storage blocks 145 in the flash storage devices 140 of the flash storage array 115. Each of the storage block addresses 505 identifies one of the storage blocks 145 in one of the flash storage devices 140 of the flash storage array 115. Although four storage block addresses 505a-d are shown in FIG. 5, the flash storage array 115 may have more or fewer storage block addresses 505.

Figure 6:
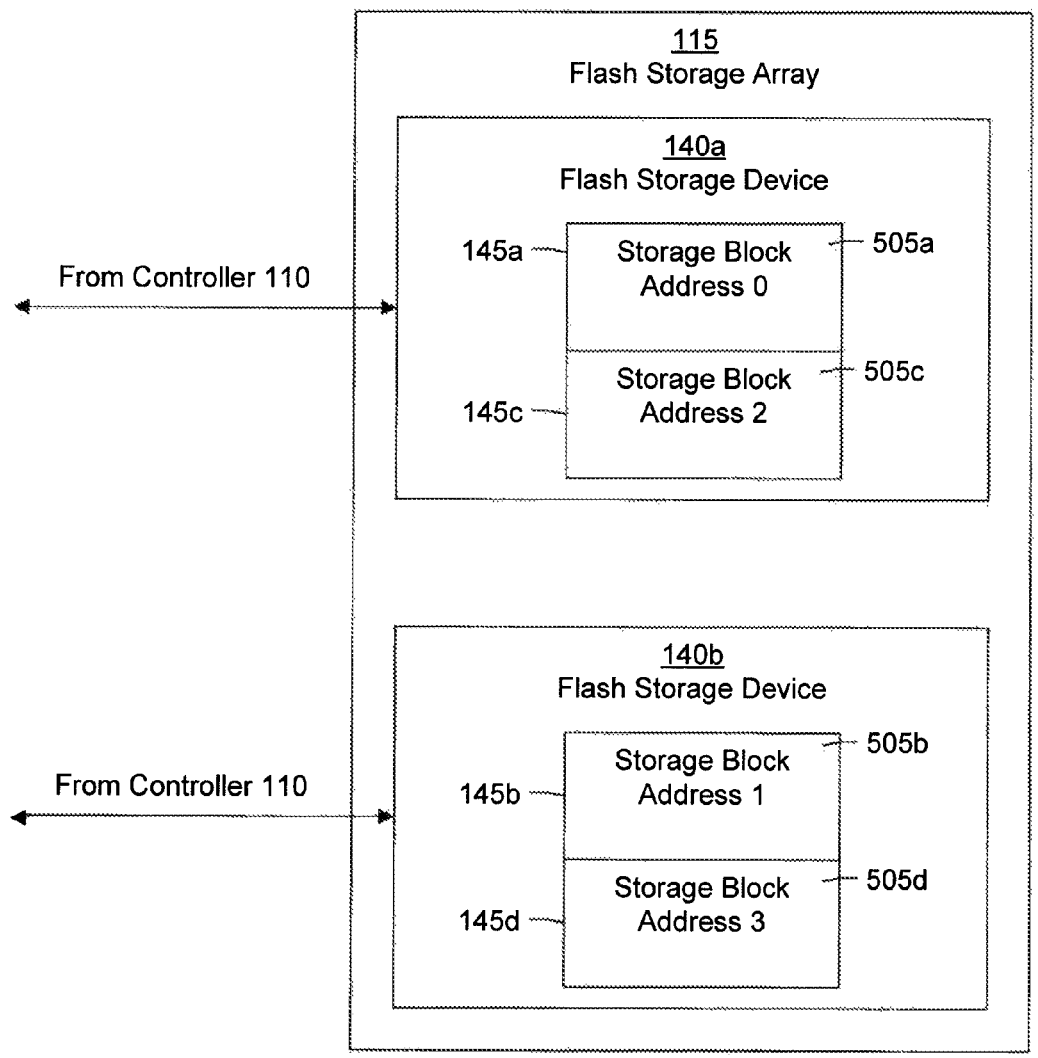
FIG. 6 is a block diagram of a flash storage array, in accordance with an embodiment of the present invention.

FIG. 6 illustrates the flash storage array 115, in accordance with an embodiment of the present invention. In the illustration, the flash storage array 115 includes two flash storage devices 140 (e.g., flash storage devices 140a and 140b). Although two flash storage devices 140a and 140b are shown in FIG. 6, the flash storage array 115 may have more or fewer flash storage devices 140. In the embodiment of FIG. 6, the controller 110 identifies storage blocks 145 (e.g., storage blocks 145a-d) for the data portions of the data block and maps the sequence of memory block addresses 405a-d of the memory blocks 120 containing the data portions to the corresponding sequence of storage block addresses 505a-d of the storage blocks 145. In this way, the sequence of memory block addresses 405a-d are interleaved among the flash storage devices 140.

In this embodiment, the data buffer 105 stores the data portions of the data block in a sequential order according to the sequence of memory block addresses 405a-d. The controller 110 initiates data transfers for writing the data portions of the data block into the storage blocks 145a-d in a sequential order according to the sequence of memory block address 405a-d. The controller 110 simultaneously writes a data portion of the data block into a storage block 145 of a flash storage device 140a and writes another data portion of the data block into a storage block 145 of the flash storage device 140b. In this way, the controller 110 initiates the data transfers sequentially according to the sequence of memory block address 405 and writes the data portions of the data block into the storage blocks 145a and 145b in parallel.

Figure 7:
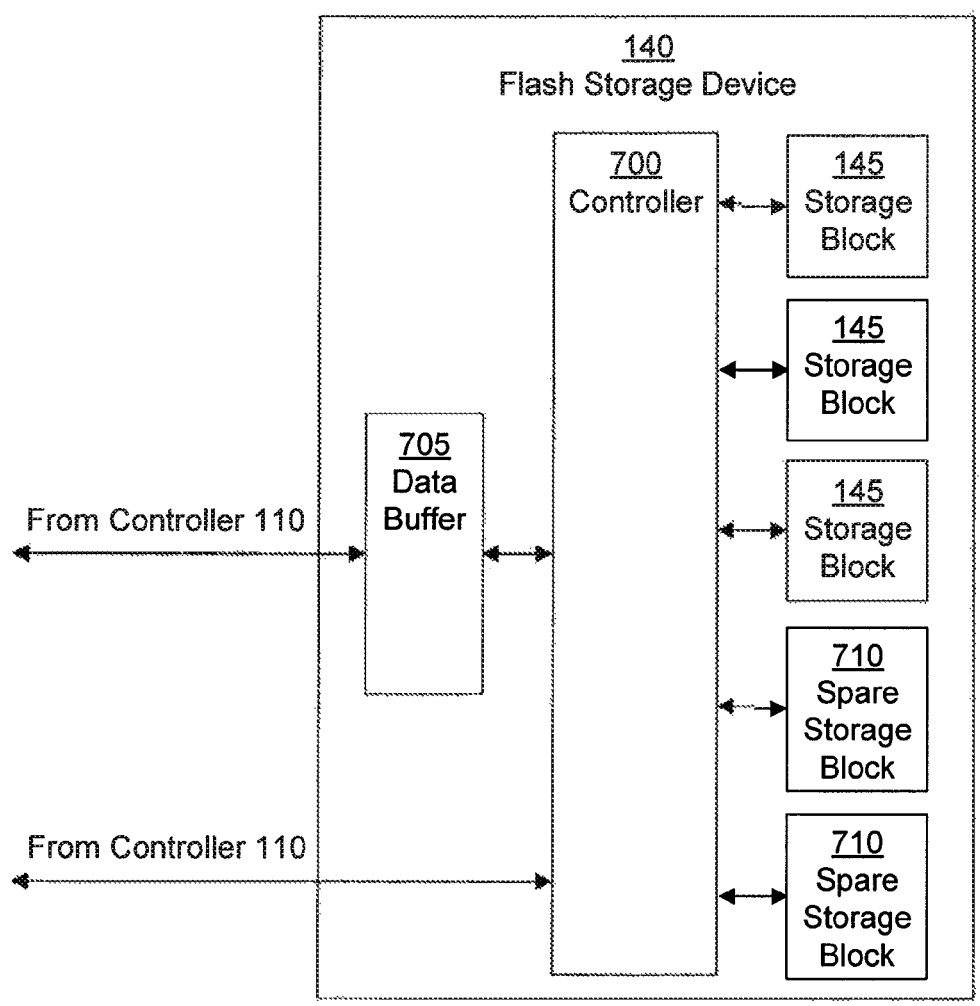
FIG. 7 is a block diagram of a flash storage device, in accordance with an embodiment of the present invention.

FIG. 7 illustrates the flash storage device 140, in accordance with another embodiment of the present invention. The flash storage device 140 includes a controller 700, a data buffer 705, storage blocks 145, and spare storage blocks 710. The data buffer 705 is coupled in communication with the controller 110 and the controller 700. The controller 700 may be a processor, a microprocessor, an embedded processor, a logic circuit, or the like. The data buffer 705 may be a random access memory, a cache memory, a logic circuit, or the like. Additionally, the controller 700 is coupled in communication with the storage blocks 145 and the spare storage blocks 710. Although three storage blocks 145 are shown in FIG. 7, the flash storage device 140 may have more or fewer storage blocks 145. Although two spare storage blocks 710 are shown in FIG. 7, the flash storage device 140 may have more or fewer spare storage blocks 710.

The controller 700 monitors the storage blocks 145 to determine whether any of the storage blocks 145 fail. If a storage block 145 fails, the controller 700 retires the storage block 145 and replaces the retired storage block 145 with one of the spare storage blocks 710. In one embodiment, the controller 700 maps logical addresses (e.g., memory addresses 205 or memory block addresses 405) of the data portions into physical addresses (e.g., storage addresses 305 or storage block addresses 505) of the storage blocks 145 in the flash storage device 140. In this way, the controller 700 maps the logical addresses of the data portions directly to physical addresses of the storage blocks 145 or the spare storage blocks 710. Alternatively, the controller 700 maps the logical addresses of the data portions to the physical addresses of the storage blocks 145 and spare storage blocks 710 by using a wear-leveling algorithm or another method.

Figure 8:
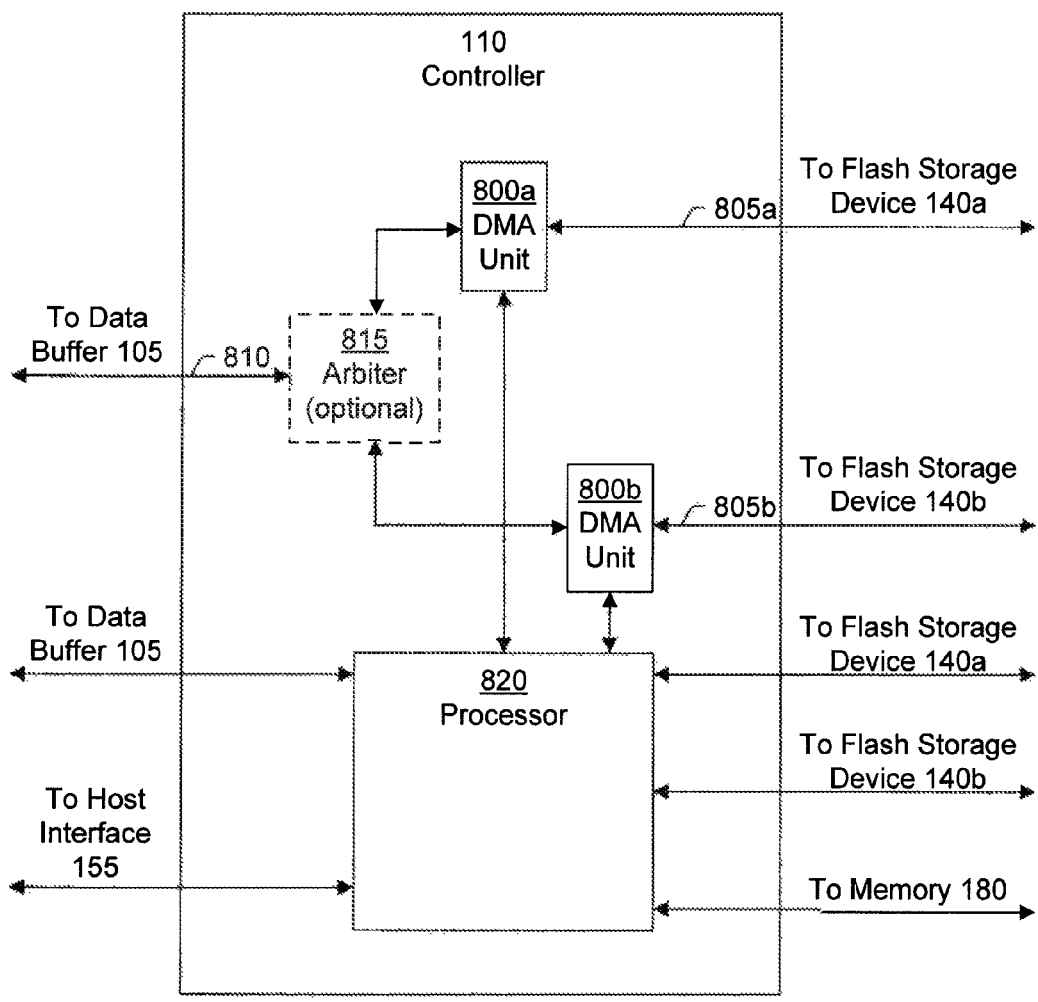
FIG. 8 is a block diagram of a controller, in accordance with an embodiment of the present invention.

FIG. 8 illustrates the controller 110 of the flash storage system 100, in accordance with an embodiment of the present invention. The controller 110 includes direct-memory-access units (DMA units) 800a and 800b, an optional arbiter 815, and a processor 820. Although two DMA units 800a and 800b are shown in FIG. 8, the flash storage device 140 may have more or fewer DMA units 800. The arbiter 815 is coupled in communication with the data buffer 105 via a data bus 810. Additionally, the arbiter 815 is coupled in communication with each DMA unit 800a and 800b. Each DMA unit 800a or 800b is coupled in communication with the respective flash storage device 140a or 140b via a respective data bus 805a or 805b. Although two data busses 805a and 805b are shown in FIG. 8, the controller 110 may have more or fewer data busses 805. The DMA unit 800 may be any device for performing a direct memory access between the data buffer 105 and the flash storage device 140 corresponding to the DMA unit 800. The arbiter 815 may be any device for arbitrating access of multiple DMA units 800 to the data bus 810.

The processor 820 is coupled in communication with the data buffer 105 and the flash storage devices 140a and 140b. In embodiments including the host interface 155, the processor 820 is coupled in communication with the host interface 155. In embodiments including the memory 180, the processor 820 is coupled in communication with the memory 180.

The processor 820 communicates with the DMA unit 800a or 800b to initiate a data transfer between the data buffer 105 and one of the storage blocks 145 of the respective flash storage devices 140a or 140b. The DMA units 800a or 800b then perform the data transfer. If the data access is a write operation, the DMA units 800a or 800b perform the data transfer by reading a data portion of the data block from the data buffer 105 and writing the data portion of the data block into one of the storage blocks 145 of the respective flash storage devices 140a or 140b. If the data access is a read operation, the DMA units 800a or 800b perform the data transfer by reading a data portion of the data block from one of the storage blocks 145 of the respective flash storage devices 140a or 140b and writing the data portion into the data buffer 105.

The arbiter 815 controls communications between the data buffer 105 and the DMA units 800a and 800b. The DMA units 800a and 800b communicate with the arbiter 815 to obtain access to the data bus 810. The arbiter 815 determines which DMA unit 800a or 800b may access the data bus 810. The DMA unit 800a or 800b that obtains access to the data bus 810 performs a data transfer between the data buffer 105 and one of the storage blocks 145 in the respective flash storage device 140a or 140b via the data bus 810 and the respective data bus 805a or 805b. The DMA unit 800a or 800b that has access to the data bus 810 then relinquishes access to the data bus 810. The DMA units 800a and 800b then communicate with the arbiter 815 and the arbiter 815 determines once again which DMA unit 800a or 800b will have access to the data bus 810.

In one embodiment, the processor 820 communicates with the DMA units 800a and 800b to initiate data transfers serially. In another embodiment, the processor 820 communicates with the DMA units 800a and 800b to initiate data transfers in parallel. In either embodiment, after the data transfers are initiated, the DMA units 800a and 800b perform the data transfers in parallel.

In an embodiment without the arbiter 815, each DMA unit 800a and 800b is coupled in communication with the data buffer 105 via an individual data bus 810. The processor 820 communicates with the DMA units 800a and 800b to initiate data transfers in parallel between the data buffer 105 and the DMA units 800a and 800b via the respective data busses 810. In this embodiment, the data buffer 105 may be a multi-port memory, such as a dual-port memory or the like.

Figure 9:
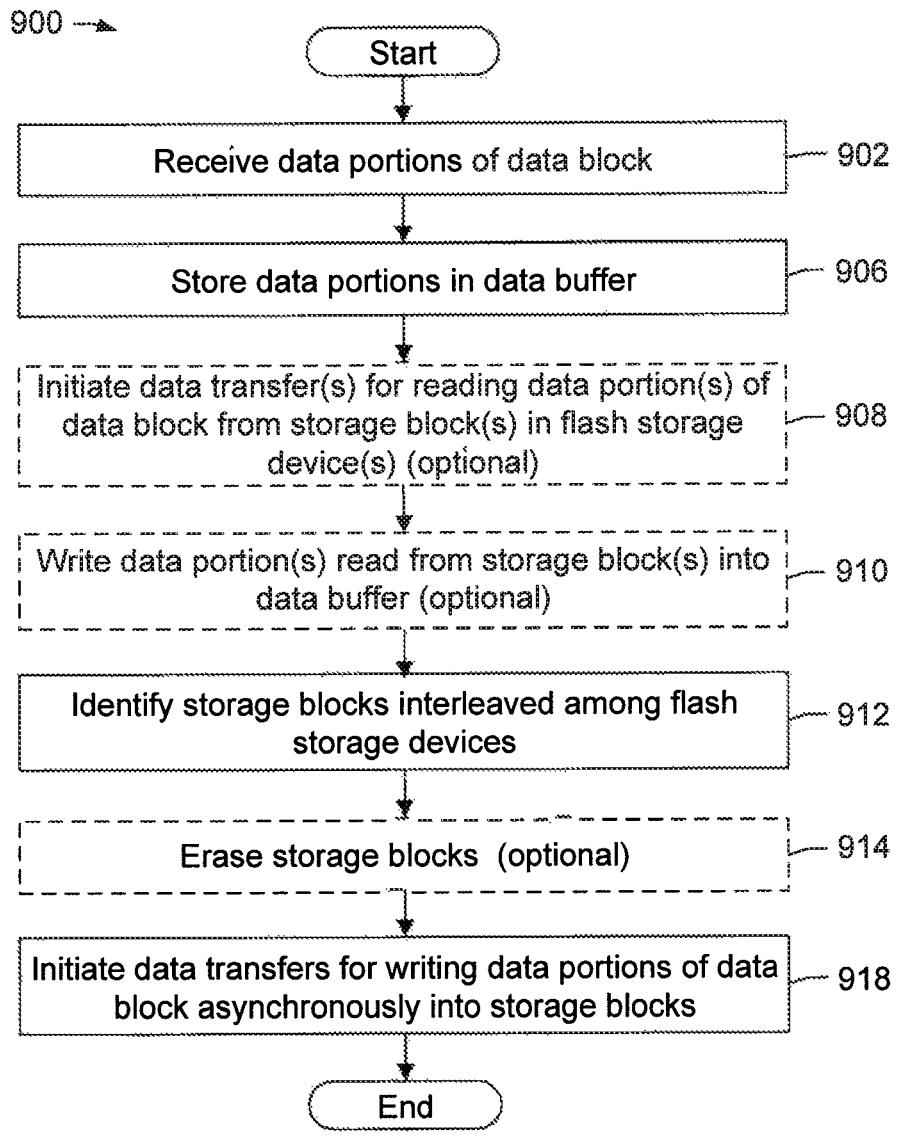
FIG. 9 is a flow chart for a method of accessing a flash storage array, in accordance with an embodiment of the present invention.

FIG. 9 illustrates a method 900 of accessing the flash storage array 115 in accordance with an embodiment of the present invention. In step 902, data portions of a data block are received. In one embodiment, the data buffer 105 receives the data portions of the data block from the host 150. In another embodiment, the host interface 155 receives the data portions of the data block from the host 150 and provides the data portions to the data buffer 105. In turn, the data buffer 105 receives the data portions from the host interface 155. The data buffer 105 receives the data portions of the data block from the host 150 or the host interface 155 serially. The method 900 then proceeds to step 906.

In step 906, the data portions of the data block are stored in the data buffer 105. In one embodiment, the data buffer 105 stores the data portions in memory blocks 120 of the data buffer 105 in sequential order according to a sequence of memory addresses 205 of the memory blocks 120. The method 900 then proceeds to step 908.

In optional step 908, the controller 110 initiates data transfers for reading data portions of the data block from storage blocks 145 in the flash storage devices 140. In one embodiment, the controller 110 reads data portions of the data block from the storage blocks 145 in the flash storage devices 140 in parallel. The method 900 then proceeds to step 910.

In optional step 910, the controller 110 writes the data portions read from the storage blocks 145 of the flash storage devices 140 into the data buffer 105. In one embodiment, the controller 110 writes data portions read from storage blocks 145 of the flash storage devices 140 into the data buffer 105 serially. The method 900 then proceeds to step 912.

In step 912, the controller 110 identifies storage blocks 145 interleaved among flash storage devices 140 in the flash storage array 115 for the data block. In one embodiment, the controller 110 identifies the storage blocks 145 based on the memory block address 405 of the memory blocks 120 containing data portions of the data block. In another embodiment, the controller 110 identifies the storage blocks 145 by selecting erased storage blocks 145 interleaved among the flash storage devices 140 and mapping the memory block addresses 405 of memory blocks 120 containing the data portions of the data block to the storage block addresses 505 of the storage blocks 145. The method 900 then proceeds to step 914.

In optional step 914, the controller 110 erases the storage blocks 145 identified in step 912. In one embodiment, the controller 110 erases the storage blocks 145 in parallel. In other embodiments, the controller 110 need not erase the storage blocks 145. The method 900 then proceeds to step 918.

In step 918, the controller 110 initiates data transfers for writing the data portions of the data block asynchronously into the storage blocks 145 identified in step 912. In one embodiment, the controller 110 initiates the data transfers by reading data portions of the data block from the data buffer 105 serially and writing the data portions of the date block into the storage blocks 145 in parallel. The method 900 then ends.

Figure 10:
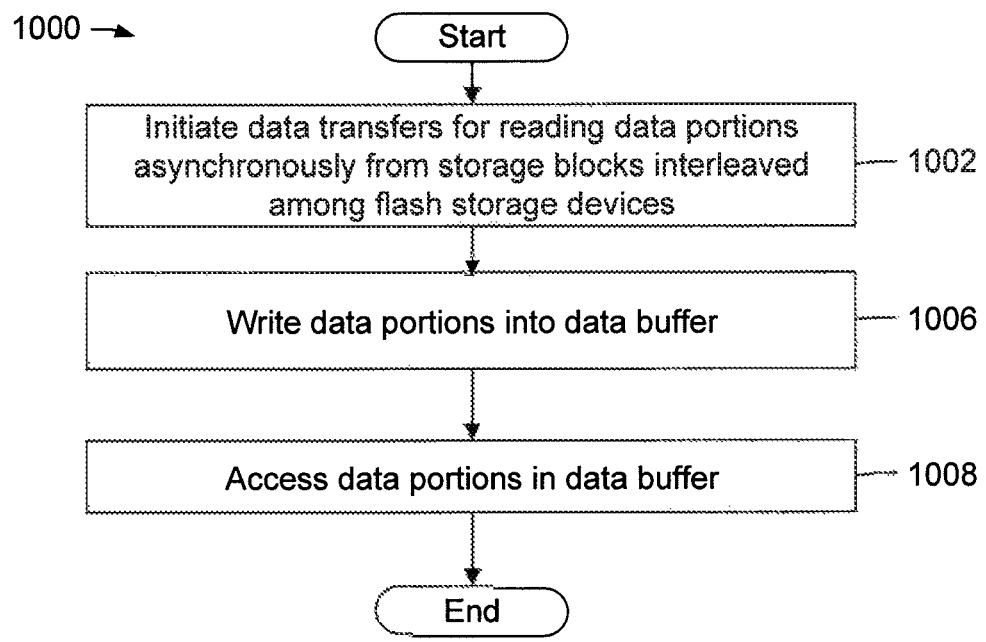
FIG. 10 is a flow chart for a method of accessing a flash storage array, in accordance with an embodiment of the present invention.

FIG. 10 illustrates a method 1000 of accessing the flash storage array 115, in accordance with another embodiment of the present invention. In step 1002, the controller 110 initiates a plurality of data transfers for reading data portions of a data block asynchronously from storage blocks 145 interleaved among flash storage devices 140 in the flash storage array 115. In one embodiment, the controller 110 reads the data portions of the data block from the storage blocks 145 in parallel. The method 1000 then proceeds to step 1006.

In step 1006, the controller 110 writes the data portions of the data block into the data buffer 105. In one embodiment, the controller 110 writes the data portions of the data block into the data buffer 105 serially. The method 1000 then proceeds to step 1008.

In step 1008, the data portions of the data block are accessed in the data buffer 105. In one embodiment, the host 150 accesses the data portions of the data block from the data buffer 105 serially. In another embodiment, the host interface 155 accesses the data portions of the data block from the data buffer 105 serially and provides the data portions of the data block to the host 150. The method 1000 then ends.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method comprising:
   initiating a plurality of data transfers for reading a plurality of data portions of a data block asynchronously from a plurality of storage blocks interleaved among a plurality of flash storage devices, wherein at least two data portions of the data block are read from the plurality of storage blocks in parallel and at least two data portions of the data block are read from a storage block of a flash storage device in the plurality of flash storage devices serially; and
   storing the plurality of data portions in a data buffer; and
   accessing the data portions of the data block in the data buffer.

2. The method of claim 1, wherein accessing the data portions of the data block in the data buffer comprises accessing the data portions of the data block serially.

3. The method of claim 2, wherein each data portion of the data block comprises an address of a sequence of addresses, and wherein accessing the data portions of the data block serially comprises accessing the data portions of the data block in sequential order according to the sequence of addresses.

* * * * *